(12) United States Patent
Sandström

(10) Patent No.: US 6,618,185 B2
(45) Date of Patent: Sep. 9, 2003

(54) DEFECTIVE PIXEL COMPENSATION METHOD

(75) Inventor: Torbjörn Sandström, Pixbo (SE)

(73) Assignee: Micronic Laser Systems AB, Taby (SE)

( * ) Notice: Subject to any disclaimer, the term of this patent is extended or adjusted under 35 U.S.C. 154(b) by 0 days.

(21) Appl. No.: 09/995,526

(22) Filed: Nov. 28, 2001

(65) Prior Publication Data

US 2003/0099026 A1 May 29, 2003

(51) Int. Cl.[7] .............................................. G02B 26/00
(52) U.S. Cl. ........................................... 359/292; 435/5
(58) Field of Search ............................ 359/292; 430/22, 430/30, 311, 5

(56) References Cited

U.S. PATENT DOCUMENTS

| | | | |
|---|---|---|---|
| 4,476,465 A | * 10/1984 | Anderson | 345/86 |
| 5,042,950 A | * 8/1991 | Salmon, Jr. | 356/520 |
| 5,123,085 A | 6/1992 | Wells et al. | 345/421 |
| 5,504,504 A | 4/1996 | Markandey et al. | 345/214 |
| 6,072,500 A | 6/2000 | Foran et al. | 345/611 |
| 6,169,282 B1 | 1/2001 | Maeda et al. | 250/310 |
| 6,261,728 B1 | 7/2001 | Lin | 430/30 |
| 6,285,488 B1 | 9/2001 | Sandstrom | 357/298 |
| 6,356,340 B1 | * 3/2002 | Spence | 355/53 |
| 6,399,261 B1 | * 6/2002 | Sandstrom | 430/30 |
| 6,428,940 B1 | * 8/2002 | Sandstrom | 430/22 |

* cited by examiner

Primary Examiner—Ricky Mack
Assistant Examiner—Brandi N Thomas
(74) Attorney, Agent, or Firm—Ernest J. Beffel, Jr.; Haynes Beffel & Wolfeld LLP

(57) ABSTRACT

The present invention relates to a method for compensating the impact of at least one defective pixel with a known position in a spatial light modulator (SLM) when creating a pattern of the SLM on a work piece covered with a layer sensitive to electromagnetic radiation. A source for emitting electromagnetic radiation is provided. Said radiation is illuminating said SLM having a plurality of modulating elements (pixels). In a writing pass an image of said modulator is projected on said work piece. A compensation for defective pixels in at least one other writing pass is performed. The invention also relates to an apparatus for performing said method.

64 Claims, 8 Drawing Sheets

DEFECTIVE PIXEL COMPENSATION METHOD

TECHNICAL FIELD

The present invention relates in general to techniques for obtaining improved images by compensation methods. In particular it relates to a method for compensating defective pixels in a Spatial Light Modulator (SLM), used in optical lithography. It also relates to an apparatus for patterning a work piece comprising such a method and a method for detecting defective pixels.

DESCRIPTION OF THE BACKGROUND ART

Lithographic production is useful for integrated circuits, masks, reticles, flat panel displays, micro-mechanical or micro-optical devices and packaging devices, e.g. lead frames and MCM's. Lithographic production may involve an optical system to image a master pattern from a computer-controlled reticle onto a workpiece. A suitable workpiece may comprise a layer sensitive to electromagnetic radiation, for example visible or non-visible light. An example of such a system is described in WO 9945435 with the same inventor and applicant as the present invention.

Said computer controlled reticle may be a Spatial Light Modulator (SLM) comprising a one or two dimensional array or matrix of reflective movable micro mirrors, a one or two dimensional array or matrix of transmissive LCD crystals, or other similar programmable one or two dimensional arrays based on gratings effects, interference effects or mechanical elements (e.g., shutters).

In general, these computer controlled reticles may be used for the formation of images in a variety of ways. These reticles, such as an SLM, include many modulating elements or pixels, in some instances million or more pixels. For example a problem with Spatial Light Modulators is that one or a plurality of pixels in a given SLM may be defective, i.e. they may not respond to a control signal as intended.

These defective pixels in a computer controlled reticle may limiting the resolution and accuracy available for their use in optical imaging; e.g., the production of printed patterns on a workpiece may be limited as to its line widths and accuracy.

Therefore, there is a need in the art for a method, which effectively and precisely finds and compensates for defective pixels in the SLM.

SUMMARY OF THE INVENTION

In view of the foregoing background, the compensation for defective pixels in the SLM, such as for example a mirror elements stuck in a specific position, is useful to form images having sub micron line widths with tolerances approaching 5 nm.

Accordingly, it is an object of the present invention to improve the images formed using spatial light modulators by providing an improved method for the compensation of defective pixels.

In a first embodiment, the invention provides a method for compensating the impact of at least one defective pixel with a known position in a spatial light modulator (SLM) when creating a pattern of the SLM on a work piece covered with a layer sensitive to electromagnetic radiation. Said method comprising the actions of providing a source for emitting electromagnetic radiation, illuminating by said radiation said SLM having a plurality of modulating elements (pixels), projecting in a writing pass an image of said modulator on said work piece, and performing a compensation for defective pixels in at least one other writing pass.

In another embodiment of the invention said electromagnetic radiation is a pulsed laser source.

In another embodiment of the invention a single defective pixel in one writing pass is compensated with a single compensating pixel in another writing pass.

In another embodiment of the invention a single defective pixel in one writing pass is compensated with a plurality of compensating pixel in another writing pass.

In another embodiment of the invention said SLM is illuminated by a radiation dose in the different writing passes.

In another embodiment of the invention said SLM is illuminated by different radiation intensities in the different writing passes.

In another embodiment of the invention said SLM is a transmissive Spatial Light Modulator.

In another embodiment of the invention said SLM is a reflective Spatial Light Modulator.

In another embodiment of the invention the pixels in said SLM is operated in an analog mainer.

The invention relates also to a method for compensating the impact of at least one defective pixel with a known position in a spatial light modulator (SLM) when creating a pattern of the SLM on a work piece covered with a layer sensitive to electromagnetic radiation. Said method comprising the actions of, providing a source for emitting electromagnetic radiation, illuminating by said radiation said SLM having a plurality of modulating elements (pixels), projecting an image of said SLM on the detector arrangement for measuring a dose of radiation, and performing a compensation of said defective pixel by at least one of the most adjacent pixels in the SLM.

In another embodiment of the invention said compensation is performed by assigning said at least one of the most adjacent pixels by a value given by subtraction of an intended pixel value by a actual pixel value divided by the number of most adjacent pixels used for compensation.

The invention relates also to a method for compensating the impact of at least one defective pixel in a spatial light modulator (SLM) when creating a pattern of the SLM on a work piece covered at least partially with a layer sensitive to electromagnetic radiation. Said method comprising the actions of, setting the pixels in said SLM in a predetermined state, illuminating by a radiation source said SLM, projecting the image of the SLM onto the detector arrangement that measures dose of the SLM pixels, identifying defective pixels, and performing a compensation for said defective pixels in at least one writing pass.

The invention relates also to a method for compensating the impact of at least one defective pixel with a known position in a spatial light modulator (SLM) when creating a pattern of the SLM on a work piece covered with a layer sensitive to electromagnetic radiation. Said method comprising the actions of, providing a source for emitting electromagnetic radiation, illuminating by said radiation said SLM having a plurality of modulating elements (pixels), projecting in a first writing pass an image of said modulator on said work piece using a first set of pixels in said SLM, performing a pre compensation for defective pixels in at least one subsequent writing pass in at least one prior writing pass, and projecting in at least a second writing pass said image of said modulator on said work piece using at least a second set of pixels in said SLM.

In another embodiment of the invention, said method further comprising the action of, performing a post compensation for defective pixels in at least one prior writing step in at least one subsequent writing pass.

In another embodiment of the invention a post compensation for defective pixels in at least one prior writing step in at least one subsequent writing pass is performed instead of said pre compensation.

In another embodiment of the invention said electromagnetic radiation is a pulsed laser source.

In another embodiment of the invention, said method further comprising the action of, including at least one pixel in said first set of pixels in said at least second set of pixels.

In another embodiment of the invention a single defective pixel in one writing pass is compensated with a single compensating pixel in another writing pass.

In another embodiment of the invention a single defective pixel in one writing pass is compensated with a plurality of compensating pixels in another writing pass.

In another embodiment of the invention said SLM is illuminated by the same radiation dose in different writing passes.

In another embodiment of the invention said SLM is illuminated by different radiation dose in different writing passes.

In another embodiment of the invention said SLM is a transmissive Spatial Light Modulator.

In another embodiment of the invention said SLM is a reflective Spatial Light Modulator.

In another embodiment of the invention the pixels in said SLM is operated in an analog manner.

In another embodiment of the invention an image of said pixels in said first writing pass is displaced in said SLM relative said image of said pixels in said second writing pass by one or a plurality of pixels.

In another embodiment of the invention an image of said pixels in said first writing pass is displaced on said workpiece relative said image of said pixels in said second writing pass by at least a fraction of a pixel.

In another embodiment of the invention said first set of pixels belongs to a first SLM and said second set of pixels belong to a second SLM.

In another embodiment of the invention said first and second SLMs are illuminated simultaneously.

In another embodiment of the invention said first and second SLMs are illuminated by different radiation intensities.

The invention relates also to an apparatus for compensating the impact of at least one defective pixel with a known position in a spatial light modulator (SLM) when creating a pattern of the SLM on a work piece covered with a layer sensitive to electromagnetic radiation, comprising a source for emitting electromagnetic radiation, a projection system to project in a first writing pass an image of said modulator on said work piece using a first set of pixels in said SLM, means for performing a pre compensation of defective pixels in at least one subsequent writing pass in at least one prior writing pass, a projection system to project in at least a second writing pass said image of said modulator on said work piece using at least a second set of pixels in said SLM, means for performing a post compensation to of defective pixels in at least one prior writing pass in at least one latter writing pass.

In another embodiment of the invention said electromagnetic radiation is a pulsed laser source.

In another embodiment of the invention at least one pixel in said first set of pixels is included in said at least a second set of pixels.

In another embodiment of the invention said projection system to project in at least a second writing pass comprises, said SLM reprogrammed with the image to be written on said work piece with said at least second set of pixels, a movable stage upon which stage said work piece is arranged in order to illuminate the same feature on said work piece with said at least second writing pass as said first writing pass.

In another embodiment of the invention said movable stage is moved the length of N SLM pixels.

In another embodiment of the invention said stage is moved along a row of pixels.

In another embodiment of the invention said movable stage is moved along a column of pixels.

In another embodiment of the invention said movable stage is moved along both a row of pixels and a column of pixels.

In another embodiment of the invention said movable stage is moved the length of N SLM pixels plus a fraction of a SLM pixel.

In another embodiment of the invention a single defective pixel in one writing pass is compensated with a single compensating pixel in another writing pass.

In another embodiment of the invention a single defective pixel in one writing pass is compensated with a plurality of compensating pixel in another writing pass.

In another embodiment of the invention said SLM is illuminated by a same radiation dose in the different writing passes.

In another embodiment of the invention said SLM is illuminated by different radiation intensities in the different writing passes.

In another embodiment of the invention said SLM is a transmissive Spatial Light Modulator.

In another embodiment of the invention said SLM is a reflective Spatial Light Modulator.

In another embodiment of the invention the pixels in said SLM is operated in an analog manner.

The invention relates also to an apparatus for compensating the impact of at least one defective pixel with a known position in a spatial light modulator (SLM) when creating a pattern of the SLM on a work piece covered with a layer sensitive to electromagnetic radiation, comprising a source for emitting electromagnetic radiation, a projection system for illuminating said SLM, having a plurality of modulating elements (pixels), by said radiation and projecting in a writing pass an image of said modulator on said work piece, the detector arrangement (65) for measuring the dose of pixels from the image of the SLM and a computer (66) for performing a compensation for defective pixels in at least one other writing pass out of said image on said detector (65).

The invention relates also to an apparatus for compensating the impact of at least one defective pixel with a known position in a spatial light modulator (SLM) (30) when creating a pattern of the SLM (30) on a work piece (60) covered with a layer sensitive to electromagnetic radiation, comprising a source for emitting electromagnetic radiation, a projection system for illuminating said SLM (30), having a plurality of modulating elements (pixels), by said radiation and projecting in a writing pass an image of said modulator

(30) on said work piece (60), the detector arrangement (65) for measuring the dose of pixels from the image of the SLM, and a computer (66) for performing a compensation for defective pixels (110) by using at least one of the most adjacent pixels (111, 112, 113, 114, 115, 116, 117, 118) to said defective pixel (110).

In another embodiment of the invention the pixel intensities are detected by said detector (65) whenever a new work piece (60) is to be patterned.

The invention also relates to a method for detecting at least one defective pixel in at least one SLM. Said method comprising the actions of addressing all pixels in said at least one SLM with a first steering signal, illuminating said at least one SLM with electromagnetic radiation, recording an image of said at least one SLM, computing a gradient field of the recorded image, computing a divergence of the gradient field, identifying extreme values from the computed divergence which corresponds to defective pixels.

In another embodiment said invention further comprising the actions of addressing all pixels said at least one SLM with a second steering signal, illuminating said at least one SLM with electromagnetic radiation, recording an image of said at least one SLM, computing a gradient field of the recorded image, computing a divergence of the gradient field, identifying extreme values from the computed divergence, where defective pixels corresponds to extreme values from said first steering signal and said second steering signal representing same pixels.

The invention also relates to a method for detecting at least one defective pixel in at least one SLM. Said method comprising the actions of addressing all pixels in said at least one SLM with a first steering signal, illuminating said at least one SLM with electromagnetic radiation, recording a first image of said at least one SLM, addressing all pixels in said at least one SLM with a second steering signal, illuminating said at least one SLM with electromagnetic radiation, recording a second image of said at least one SLM, computing the difference between said first image and said second image, identifying bad pixels where the computed difference has a local minimum.

The invention also relates to a method for detecting at least one defective pixel in at least one SLM Said method comprising the actions of addressing a pattern to said at least one SLM, illuminating said SLM with electromagnetic radiation, recording a first image of said at least one SLM, comparing said recorded image with pattern data at feature edges, identifying bad pixels where the feature edge is moved a predetermined distance.

In another embodiment said pattern is a chessboard pattern.

In another embodiment said pattern is a pattern with parallel lines.

In still another embodiment said method further comprising the action of addressing said pattern with another set of pixels in said at least one SLM, illuminating said SLM with electromagnetic radiation, recording a second image of said at least one SLM, comparing said recorded second image with pattern data at feature edges, identifying bad pixels where the feature edge is moved a predetermined distance.

In still another embodiment said method further comprising the action of comparing the feature edge movement in said first image with said second image for identifying bad pixels stuck at intermediate values.

In yet another embodiment said different writing passes is performed by means of one SLM.

In yet another embodiment said different areas of said SLM are used in the different writing passes.

In yet another embodiment said different writing passes is performed by means of a plurality of SLMs.

In yet another embodiment said different writing passes is performed by means of one SLM.

In yet another embodiment said different areas of said SLM are used in the different writing passes.

In yet another embodiment said different writing passes is performed by means of a plurality of SLMs.

BRIEF DESCRIPTION OF THE DRAWINGS

For a more complete understanding of the present invention, and the advantages is thereof, reference is now made to the following description taken in conjunction with the accompanying drawings, in which.

DETAILED DESCRIPTION OF THE PREFFERED EMBODIMENTS

Workpiece in the description below is meant to mean one of the group of: substrate for producing semiconductors (direct write), mask substrate, reticle substrate.

Figure 3:
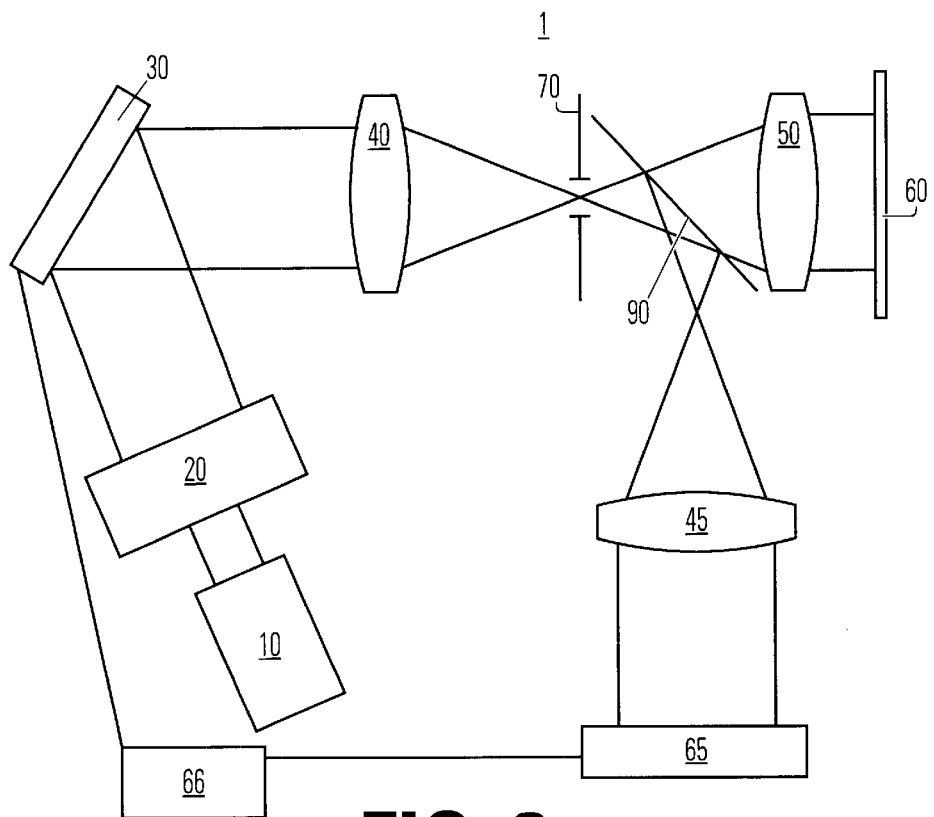
FIG. 3 illustrates a view of the principal components in an optical lithography system using an SLM, which may use the inventive method.

FIG. 3 illustrates an exemplary embodiment of an apparatus 1 for patterning a work piece 60. Said apparatus 1 comprising a source 10 for emitting electromagnetic radiation, a first lens arrangement 50, a computer controlled reticle 30, a beam conditioner arrangement 20, a spatial filter 70 in a Fourier plane, a third lens arrangement 40, a second lens arrangement 45, a beam splitter 90 and a detector arrangement 65, a computer 66.

The source 10 may emit radiation in the range of wavelength from infrared (IR), which is defined as 780 nm up to about 20 nm, to extreme ultraviolet (EUV), which in this application is defined as the range from 100 nm and down as far as the radiation is possible to be treated as electromagnetic radiation, i.e. reflected and focused by optical components. The source 10 emits radiation either pulsed or continuously. The emitted radiation from the continuous radiation source 10 can be formed into a pulsed radiation by means of a shutter located in the radiation path between said radiation source 10 and said computer controlled reticle 30. As an example can the radiation source 10, i.e. the source of an exposure beam, may be a KrF excimer laser with a pulsed output at 248 nm, a pulse length of approximately 10 ns and a repetition rate of 1000 Hz. The repetition rate may be below or above 1000 Hz.

Not shown in FIG. 3 is an aperture located between the radiation source and the SLM. The size of the aperture in combination with the Fourier aperture may be changed in order to increase/decrease the resolution on the workpiece with constant σ.

The beam conditioner arrangement may be a simple lens, an assembly of lenses, and/or other optical components. The beam conditioner arrangement 20 distributes the radiation emitted from the radiation source 10 uniformly over at least a part of the surface of the computer-controlled reticle 30. In a case of a continuous radiation source a beam of such a source may be scanned over the surface of the computer controlled reticle.

Between the radiation source 10 and the computer-controlled reticle 30, which may for instance be a spatial light modulator (SLM), said beam conditioner arrangement is arranged, which unit 20 expand and shapes the beam to illuminate the surface of the SLM in a uniform manner. In a preferred embodiment with an excimer laser as the source the beam shape is rectangular, the beam divergence different in x-direction and Y-direction and the radiation dose is often non-uniform over the beam cross-section. The beam may have the shape and size of the SLM 30 and homogenized so that the rather unpredictable beam profile is converted to a flat illumination with a uniformity of, for example, 1–2%. This may be done in steps: first beam shaping step, a homogenizing step and a second beam-shaping step. The beam is also angularly filtered and shaped so that the radiation impinging on each point on the SLM has a controlled angular sub tense.

The optics of the invention is similar to that of a wafer stepper. In steppers, the beam is homogenized in a light pipe. Said light pipe might be a rectangular or prism-shaped rod with reflecting internal walls, where many mirror images of the light source are formed, so that the illumination is a superposition of many independent sources. Splitting and recombining the beam by refractive, reflective or diffractive optical components might also perform the homogenization.

The electromagnetic radiation is directed towards the detector arrangement that measures the dose of electromagnetic radiation, which may comprise a Charged Coupled Device (CCD) camera, a MOS-camera, or a Charged Injection Device (CID). The first lens arrangement 50 plays mainly the same role as the second lens arrangement 45, namely to create an identical image of the SLM surface on the work piece 60.

The SLM 30 and the detector arrangement for measuring dose of electromagnetic radiation 65 are connected to a control device 66, which for example can be a personal computer. The computer keeps track of defective pixels and compensates for the defective pixels according to inventive methods described herein below.

Figure 1:
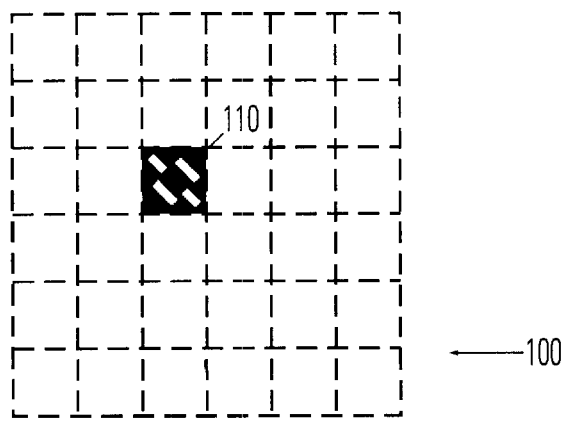
FIG. 1 illustrates a portion of the top view of an array of pixels in a Spatial Light Modulator (SLM) comprising a defective pixel.
Figure 8:
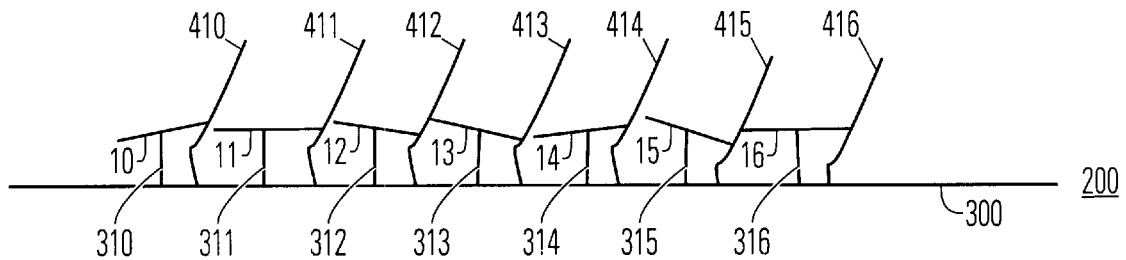
FIG. 8 depicts a section view of SLM pixels without control signals.

FIG. 8 illustrates one dimension from the array of pixels 200 in the Spatial Light Modulator (SLM) as shown in FIG. 1. In this embodiment the pixels 200 comprises movable micro mirrors 10, 11, 12, 13, 14, 15, 16 said pixels being arranged movably coupled to a substrate 300 comprising support members 310, 311, 312, 313, 314, 315, 316 for said movable micro mirrors 10, 11, 12, 13, 14, 15, 16 and address electrodes 410, 411, 412, 413, 414,415,416.

By applying a first control signal, e.g. a first voltage, on said address electrodes 410, 411, 412, 413, 414, 415, 416 and a second control signal, e.g. a second voltage, on said movable micro mirrors 10, 11, 12, 13, 14, 15, 16, said micro mirrors 10, 11, 12, 13, 14, 15, 16 may deflect around a deflection axis defined by a hinge arranged (coupled?) to the support members 310, 311, 312, 313, 314, 315, 316. The degree of deflection of each of the micro mirrors will be related to the signal differential, e.g., voltage differential, between said address electrodes 410, 411, 412, 413, 414, 415, 416 and said movable micro mirrors 10, 11, 12, 13, 14, 15, 16. The view shown in FIG. 2a may represent (slightly exaggerated for clarification) an electrostatically unattracted state in which no voltage is applied to the address electrodes 410, 411, 412, 413, 414, 415, 416 or the movable micro mirrors 10, 11, 12, 13, 14, 15, 16.

FIG. 8 illustrates a random deflection arrangement of the movable micro mirrors 10, 11, 12, 13, 14, 15, 16 due to various factors. Said deflection randomness of the movable micro mirrors 10, 11, 12, 13, 14, 15, 16 may be compensated for. Moreover, the thickness of the movable micro mirrors 10, 11, 12, 13, 14, 15, 16 and/or the thickness of an optional reflective coating of the micro mirrors may vary from one pixel to another, which in turn may affect the reflectivity of the movable micro mirrors 10, 11, 12, 13, 14, 15, 16. Another difference between the individual micro mirrors 10, 11, 12, 13, 14, 15, 16 may be that they may respond differently to an equivalent potential difference between said movable micro mirror 10, 11, 12, 13, 14, 15, 16 and said address electrode 410, 411, 412, 413, 414, 415, 416. Given the same potential difference between said movable micro mirror 10, 11, 12, 13, 14, 15, 16 and said address electrode 410, 411, 412, 413, 414, 415, 416, hinges with a small cross sectional area will result in a bigger deflection compared to hinges with a bigger cross sectional area. Different surface smoothness of the micro mirror may also affect the reflectivity as the distance between the substrate and the micro mirror. Size differences of the pixels may also affect the reflectivity.

Figure 9:
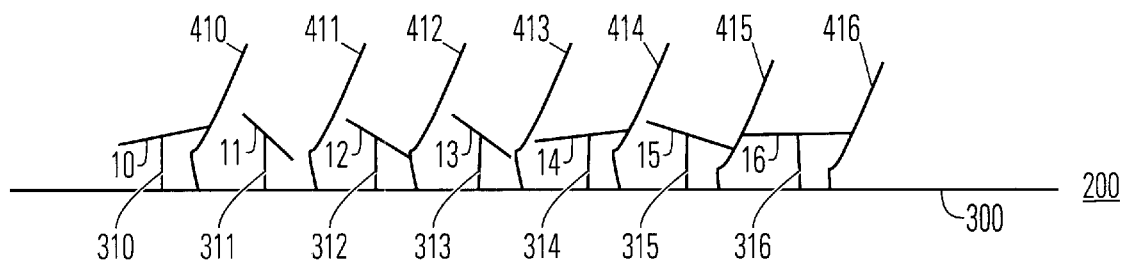
FIG. 9 depicts the same pixels with control signals, but without pixel calibration.

FIG. 9 illustrates a side view of the section of the array of pixels in the Spatial Light Modulator (SLM) as shown in FIG. 1, where some pixels are addressed, some are not addressed and all pixels are uncalibrated. Addressed pixels are pixels 11, 12 and 13 and unaddressed pixels are pixels 10, 14, 15 and 16. As can be seen from FIG. 2b, the addressed pixels 11, 12, 13 are not deflected equally, although they have been addressed with the same control signal. This is an example of the different response characteristics each mirror may exhibit.

Figure 10:
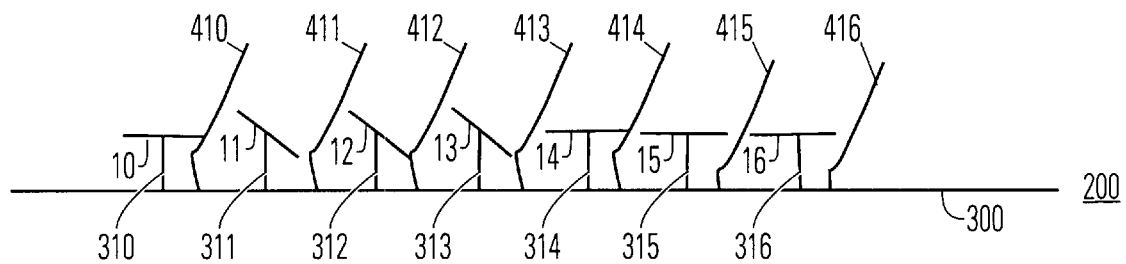
FIG. 10 illustrates the same pixels and control signals as FIG. 2b, but with pixel calibration.

FIG. 10 FIG. 2c illustrates the same side view of the section of the array of pixels in the Spatial Light Modulator (SLM) as shown in FIG. 2b, but here with calibrated pixels.

As can be seen, the addressed pixels 11, 12 and 13 are deflected equally and the unaddressed pixels 10, 14, 15 and 16 are all parallel with the substrate 300. In the alternate case where differences in reflectivity of one pixel compared to another pixel might exist, the deflection of said pixels would not be equal in order to produce equivalent reflected electromagnetic radiation signals.

FIG. 1 shows a Spatial Light Modulator (SLM) 100 comprising a 2-dimensional array of pixels, in this embodiment 6 rows with 6 pixels each, i.e. 36 pixels in total. In reality the SLM may comprise several millions of pixels but for reasons of clarity an SLM with few pixels is illustrated in FIG. 1. Pixel 110 is in FIG. 1 printed in black, thereby representing a defective pixel, i.e. said pixel is stuck in a specific position and does not respond to a calibration. A defective pixel means a pixel stuck in an on state, an off state or any state between said on state and said off state.

In a more general sense, a defective pixel is any pixel the response of which is outside acceptable specifications or operating limits. If a sensitivity variation to the address signal is determined to be ±5%, any pixel with a sensitivity diverging more than 5% is a defective pixel.

Defective pixels will most likely not be controlled in a desired manner. In the case of a mirror pixel, said pixel may reflect to less or too much of the incident radiation or in the case of LCD pixel said pixel may be too less transmissive or too much transmissive.

The pixels in the SLM may be operated in an analog manner. Micro mirror pixels are typically operated electrostatically. Piezoelectric crystals might also operate micro mirrors. By setting the mirrors to a first potential and by setting an individual address electrodes below said mirrors to a second potential, a difference between said first and second potentials will deflect said mirror a certain amount. The bigger the potential difference between said address electrode and said mirror element the more said mirror might deflect. A given potential difference corresponds to a given deflection for a given mirror and therefore the deflection can be set to a plurality of states between a nondeflected state, i.e., the mirror is electrostatically unattracted, and a fully deflected state.

Figure 2:
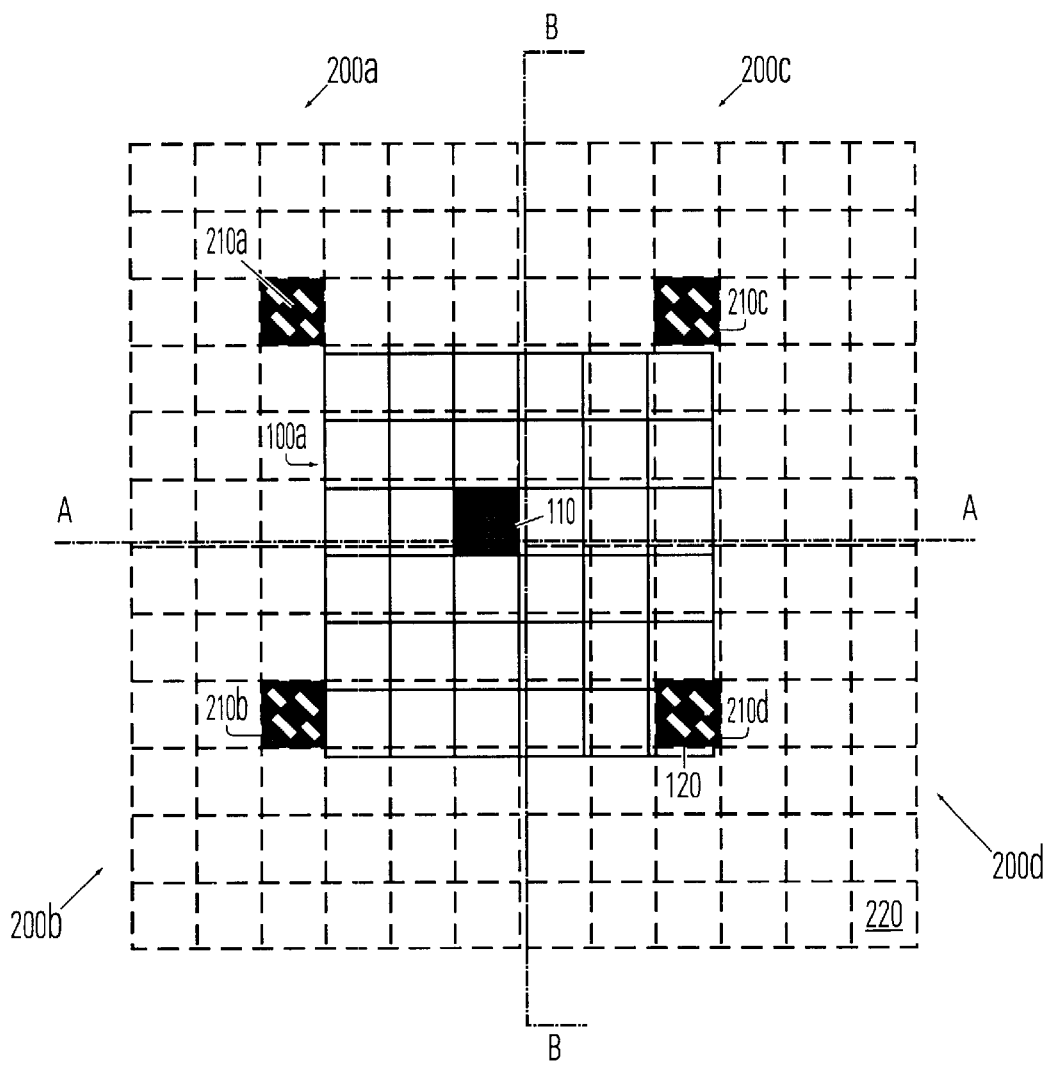
FIG. 2 illustrates a defective pixel in two overlaid writing passes with displaced fields.

FIG. 2 shows two different writing passes, where a writing stamp 100a belongs to a first writing pass which is written before writing stamps 200a, 200b, 200c and 200d, which belong to a second writing pass, i.e. writing stamps 200a, 200b, 200c and 200d are partly overlaid on top of writing stamp 100a. The boundaries between the writing stamps 200a, 200b, 200c and 200d are for reason of clarity highlighted with dashed-dotted lines A—A and B—B. The SLM used may have one or a plurality of defective pixels but for reasons of clarity only one defective pixel 110, 210a, 210b, 210c, 210d is indicated in FIG. 2. An image from the SLM on a work piece will typically cover only a small portion of the complete pattern, therefore when creating a complete pattern on a work piece a plurality of different SLM patterns (SLM stamps) are stitched together.

A specific area in the pattern on the work piece may be written with one or a plurality of writing passes. The writing passes may be separate physical passes or be exposures of different areas of the same SLM in a single physical pass. It is also possible to use several SLMs simultaneously where a second pass may be an image from a second SLM. In FIG. 2 two writing passes are used to create the pattern. If one writing pass is used to create the pattern a dose of electromagnetic radiation higher than the exposure threshold must be used in order to expose a photosensitive layer (resist layer) arranged on the work piece. If N writing passes are used said exposure threshold can be divided N times, i.e. one writing pass is only using a part of the dose required to expose the photosensitive layer. Every single writing pass may use the same dose of electromagnetic radiation but said dose may also be divided unequal between the different writing passes.

Figure 4:
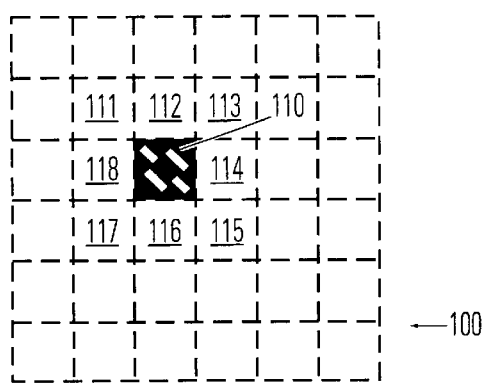
FIG. 4 illustrates a portion of the top view of an array of pixels in a Spatial Light Modulator (SLM) comprising a defective pixel and compensating pixels.

Accordingly, the first and second writing passes might use 75% of the threshold dose or any other unequal or equal split of the threshold dose. The defective pixel 110 in the first writing pass can be compensated for by a post compensation pixel 220 belonging to the writing stamp 200a in the second writing pass. For reason of clarity said post compensation pixel 220 is only indicated in stamp 200d, i.e., pixel 220 has the same position in stamp 200a. If the defective pixel is too bright then the post compensation pixel is set to a lower value in order to compensate the excess of illumination in the first writing pass by said defective pixel 110. In order to further suppress the impact of a too bright pixel in the first writing pass, a number of surrounding pixels 111, 112, 113, 114, 115, 116, 117, 118 (see FIG. 4) to said defective pixel 110 can be set to a lower value, i.e. be set to reflect less electromagnetic radiation. Said surrounding pixels can be used immediately in the first writing pass and/or in later writing passes.

In a multiple writing pass scheme as shown in FIG. 2 the defective pixel will not only affect the first writing pass but also the second writing pass. In the four writing stamps 200a, 200b, 200c and 200d in the second writing pass as indicated in FIG. 2 said defective pixel will show up in four new locations 210a, 210b, 210c, 210d.

Because it is established which pixels are defective and it is known how many pixels the image of the SLM is to be moved in each direction, a pre compensation for a impact of the defective pixel in the second writing pass may be performed already in the first writing pass. The image of the SLM may for instance be moved, as illustrated in FIG. 2, in a direction parallel to both a row and column of pixel, i.e. in an essentially diagonal direction. However, the image of the SLM may only be moved along a direction parallel to a column of pixels or along a direction parallel to a row of pixels. Said movement of the image of the SLM may be performed in steps of whole SLM pixels and/or parts thereof.

Defective pixel 210d, in FIG. 2, belonging to the writing stamp 200d in the second writing pass, may cause some problem at a place where the fully functional pixel 120 belonging to the writing stamp 100a in the first writing pass is located. Therefore a pre compensation may be performed in the first writing pass in pixel 120 for the defective pixel 210d belonging to writing stamp 200d in the second writing pass in the same manner as described above, i.e. with said pixel 120 alone and/or with adjacent pixels to said pixel 120.

Having two or more writing passes the pre compensation for defective pixels in at least one subsequent writing pass may be performed in at least one prior writing pass. Post compensation for bad pixels in at least one prior writing pass may be performed in at least one subsequent writing pass. I other words, a known bad pixel will make a defective local print in at least one subsequent writing pass which is compensated for in at least one previous pass and those defective local prints made in at least one previous writing pass may be compensated for in at least one subsequent writing pass.

In one embodiment of the invention the imaged pattern on the work piece is written in a single writing pass and defective pixels are compensated for by at least one of the adjacent pixels to sad defective pixels. For example in FIG. 4 defective pixel 110 is only compensated for by one or a plurality of pixels 111, 112, 113, 114, 115, 116, 117, 118.

In a multipass writing strategy the image from the SLM may be displaced N pixel lengths along a row of pixels, along a column of pixels or along both a row and a column of pixels between at least two of said writing passes. The image from the SLM may be displaced by moving a stage on which a substrate to be written is arranged. Between one or a plurality of said writing passes the SLM may be displaced only a fraction of a pixel length in a direction parallel to a row of pixels, in a direction parallel to a column of pixels or along both a row and a column of pixels.

In one embodiment of the calibration process for locating and determining which pixel(s) are defective in the SLM comprises the following actions.

Optionally, the method begins with a calibration of the dose of electromagnetic radiation. A CCD camera has a specific working range of electromagnetic radiation doses. Preferably, the dose of electromagnetic radiation lies around 0.8*max range of the CCD camera. With a too low dose projected onto the CCD, the signal to noise ratio will in some cases be unacceptable low. With a too high dose projected onto the CCD camera, the CCD camera will be over saturated, with the result of an inaccurate measurement.

The calibration of the dose of electromagnetic radiation may be performed by starting with an SLM with all pixels unaddressed, i.e. no control signals applied to the pixels. The electromagnetic radiation is projected on said CCD via said SLM. The dose of electromagnetic radiation is measured on said CCD. After said measurement, the dose may be corrected by adjusting the electromagnetic radiation source. Increasing or decreasing the power of said pulsed electromagnetic radiation source might perform said dose adjustment. A higher power will result in a higher dose on said CCD and a lower power will result in a lower dose on said CCD.

Optionally, said imaging detector, e.g., the CCD camera, is precalibrated. Said precalibration of the CCD camera may be performed by projecting a known electromagnetic radiation beam with approximately the same wavelength, e.g. a discharge lamp, and an interference filter to select a narrow wavelength range close to the wavelength of the exposure beam, and measuring the dose in each pixel of the CCD camera. The object of this precalibration is to be sure about that the same dose illuminated at each pixel in the CCD camera will be measured as the same dose, i.e. every pixel after said precalibration shall be equally sensitive to electromagnetic radiation, and by so doing the accuracy of the measurement will be enhanced.

Figure 12:
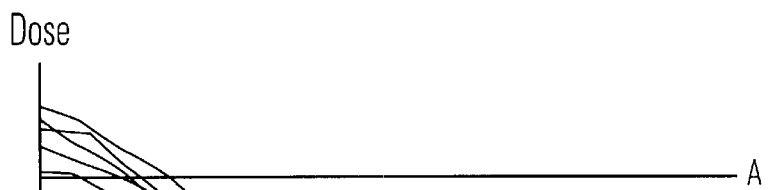
FIG. 12 illustrates a plurality of dose responses as a function of the control signals applied to their respective pixels.

The calibration of the SLM continues with finding the SLM average intensities as a function of control signal. The object of finding the SLM average intensities as a function of applied control signal is to find a control signal for a predetermined dose, for example zero doses. This is performed by looping the control signals, for example from 0–255, for each pixel. For a given control signal, all pixels are measured and the average for the measured pixels is calculated. An example of a number of pixel intensities as a function of applied control signal is shown in FIG. 12. In said figure the horizontal lines A and B represent the dynamic range, representing levels attainable by all mirrors.

When searching for the control signals for the next dose signal one can guess the derivative of the calibration curve in order to reduce the number of steps to find the right control signal for each pixel. As the number of known points on the calibration curve increases the steps to find the right control signal for a specific dose value decreases since the information about the calibration curves are enhanced by said known points.

Next the pixels in the SLM are mapped with the pixels in the CCD. The object of this is to establish a known relation between the pixels in the SLM and the pixels in the CCD camera. First a coarse grid of clusters of pixels in said SLM is measured in the CCD camera. For example, a 5 by 5 array cluster with 30 pixels in between each cluster. This will produce a distinctive signal on the CCD. The SLM is provided with a special pattern in order to be able to know which part of the SLM that is studied. When only a part of the SLM area is studied at a time, it is important to know which part that is studied. The cluster of pixels may be moved from one part to another in the SLM area. The pixels in the cluster are set to a value, which is distinctive from the nearby unaddressed pixels.

The image on the CCD at this stage may correct for translation deviations, scale errors, mirror effects and rotational errors between said SLM and said CCD according to the formula $\overline{A}=M*S*R*(\overline{E}-t)$, where $\overline{A}$ is the CCD coordinate, M=mirroring, S=scale factor, R=rotation, $\overline{E}$=SLM coordinate and t=translation. $\overline{E}$ and $\overline{A}$ are vectors containing coordinates for the SLM pixel and CCD-pixel respectively. M may for instance be the 2×2 unity matrix or mirroring matrix. S may be any figure between 0-infinity, but preferably between 0–3. R may be a 2×2 matrix with $\cos(\alpha)$ in the upper left position, $-\sin(\alpha)$ in the upper right position, $\sin(\alpha)$ in the lower left position and $\cos(\alpha)$ in the lower right position, where $\alpha$ is typically a few milliradians. In a general case the mapping is a non linear mapping, having for instance a t factor that is a function of the coordinates.

In a preferred embodiment of this invention the single pixels in the SLM are not resolved in the CCD camera.

Secondly a finer grid of the cluster of pixels in said SLM is measured on the CCD. At this stage, with a finer grid, the number of pixels at each pixel cluster in the SLM may be a 3 by 3 array with for example 20 pixels in between each cluster.

Thereafter a further refinement of the cluster of pixels in the SLM is measured on the CCD, for example with a single pixel in the cluster with 10 pixels in between.

As a further refinement of the mapping of SLM to the CCD a non-linear correction may be added. This means that y=MSR(x−t)+non-linear correction. This non-linear correction is for example computed by assigning second order polynomial expressions with unknown coefficients a–j. Such polynomial expression may be:

$$nc\_1=ax+by+cx^2+dy^2+exy, \; nc\_2=fx+gy+hx^2+iy^2+jxy,$$

where nc_1 is the nonlinear correction for coordinate x and nc_2 is the nonlinear correction for coordinate y. If the correction varies with (x,y), as in this case, a position dependent non-linear correction U can be fitted to the function (nc_1, nc_2)(x,y) by using the least square fit method.

Figure 5:
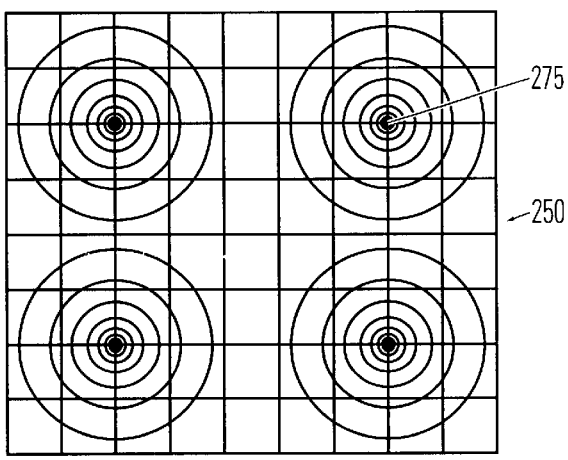
FIG. 5 illustrates the relationship between the pixels in the detector arrangement and the dose distribution of the image produced by four pixels of an SLM.

In a further improvement, a correction for the spot position relative to a CCD pixel grid may be applied to remove or reduce Moire effects, due to an insensitive area between the CCD pixels or similar effects. The magnification in the projection system may or may not be adjusted, so that the image of the sub-matrix is adjusted with the pixel pattern on the CCD, e.g. the CCD may have one pixel per two pixels in the SLM or another rational relation. The CCD pixels typically have a capacity of 100.000 electrons. In the measurement region formed by several pixels the capacity may be larger by a numerical factor representing the number of pixels, e.g. 4 or 16 as shown in FIG. 5. The typical number of electrons in a region is 200.000 and the number has a statistical distribution (Poisson distribution). To average this random effect as well as other randomness every measurement is repeated N times. At the same time Moire effects can be averaged if the image is moved over the CCD-camera during the N measurements.

The CCD-camera is for example a camera from Kodak® KAF 1600 with approximately 1000*1600 pixels and sensitivity for the wavelength used, e.g. 248 nm or 197 nm. Typically this involves converting the radiation to visible light by a fluorescent dye, but camera chips which are directly sensitive to short wavelength, e.g. 248 nm are also available.

Figure 11:
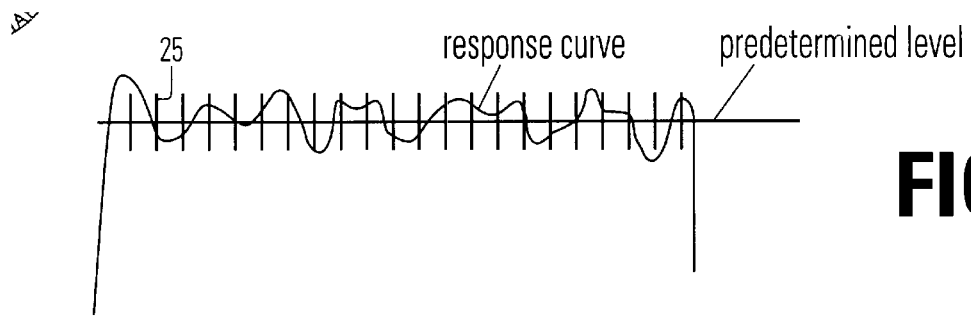
FIG. 11 illustrates the response of a portion of the CCD to the uncompensated image produced by an uncalibrated SLM.

In the next step the control signal is searched for, which gives rise to a predetermined dose value on the CCD. By having a good knowledge of where a specific SLM pixel will be detected on the CCD, said image on the CCD camera can be corrected in order to arrive at said predetermined value for all pixels. FIG. 11 illustrates a typical response on the CCD camera for a projected electromagnetic radiation onto an uncalibrated SLM. Vertical lines 25 represent a boundary between two pixels. As can be seen some mirrors are giving rise to too much reflectance and some mirrors are giving rise to too low reflectance than desired. As we know the relationship between the SLM and CCD pixels we can change the state of the SLM mirrors/pixels, which are too reflective or too less reflective. By changing the state of those mirrors/ pixels and projecting a new image on the CCD a new response, will appear. The change of state of the mirrors, are changed in finer steps than the difference between the predetermined value and the factual value. This is done in order to be sure to have a method that is convergent. After having changed the pixels and projected the image of the SLM onto the CCD a number of times the pixels are calibrated. A condition for stopping the calibration for this particular predetermined dose value, might be that the standard deviation of the detected mirrors on the CCD less than 0.5%.

Next the different predetermined dose values are stepped through in the same way as described above. After this, a good knowledge about the reflectance as a function of voltage for each mirror exists.

Optionally the common maximum and minimum reflectance attainable by all mirrors are to be found. Between those values, the inverse, i.e. voltage as a function of reflectance, is well defined for all mirrors, and those are the functions that is to be find approximate expressions for, using a limited space of storage for each mirror. In FIG. 12, reflection as a function of voltage is shown for a number of different mirrors. Since the entire array has to have common "white" and "black" levels (as seen by the CCD), the dynamic reflectance range for the whole array will be limited by levels attainable by all mirrors (as indicated by lines A and B in FIG. 12. Depending on the requirement on the dynamic range, we may have to exclude the use of some mirrors beyond those being defective. Such mirrors may still be used, although with a larger compensation error in "black" or "white" levels. When the "white" and "black" levels are selected, we may begin to calibrate each individual mirror within that reflectance range.

Figure 13:
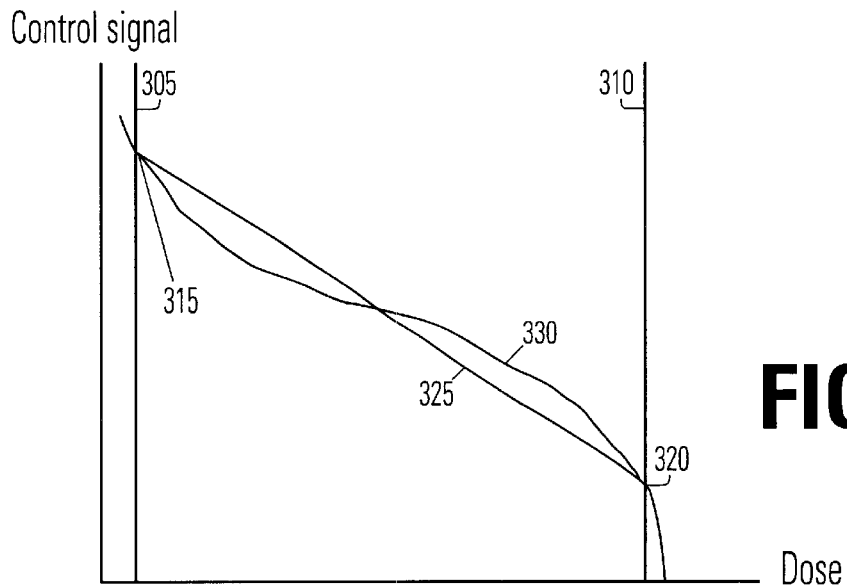
FIG. 13 illustrates a possible relationship between the control signal applied to a pixel and the detected dose.

A way of finding the common expression for the voltage as a function of reflectance doze is by interpolation using Fourier methods. For instance each mirror is calibrated using four parameters. FIG. 13 illustrates the voltage as a function reflectance doze. In this figure the common "black" level 305 and the common "white" level 310 is indicated with vertical lines. The first two calibration parameters can be identified as the driving voltage at the intersections 315, 320 of the mirror response and the "black" and "white" levels 305, 310. The remaining calibration parameters are obtained by calculating the Fourier coefficients of the difference between the mirror voltage and the straight line 325 that interpolates the reflectance between the "black" and "white" levels. Since we have, by construction, zero error at the end points, it is sufficient to use $\sin(\pi x)$ and $\sin(2\pi x)$ as the harmonics functions in a Fourier expansion. The variables x equals $(z-z\_"black")/(z\_"white"-z\_"black")$, which has the closed range $x=(0,1)$.

If assigning two calibration parameters to describe the straight line 325, one may use another two as coefficients for the base functions $\sin(\pi x)$ and $\sin(2\pi x)$. A calibration expression would then be $z=a+bx+c(\sin(\pi x))+d(\sin(2\pi x))$, where a, b, c and d are unique for every pixel and $\sin \pi x$ and $\sin 2\pi x$ are common to all pixels.

Alternatively, instead of expanding the difference of the straight line that interpolates the reflectance function (see FIG. 8) into just $\sin(\pi x)$ and $\sin(2\pi x)$, the difference may be expanded at a larger number of Fourier components. Having M mirrors (and consequently M functions) and expanding into N components gives us a matrix A having a dimension NXM. The base functions may now be chosen by selecting the two eigenvectors of (the square matrix) $AA^t$, where t stands for transpose, with the largest eigenvalues. The base functions obtained in this way are still sine like (although the choice of Fourier base is insignificant), but fit the data without average (or systematical) errors.

The calibration coefficients a, b, c and d are found by solving $Ac=Y$, where A is a 4×4 matrix and Y is a 4×1 vector. The elements of the matrix are $$A_{ij} = \sum_m w(x_m) f_i(x_m) f_j(x_m) \text{ and } Yi = \sum_m w(x_m) y_m f_i(x_m),$$

where Y is the voltage at some (normalized) reflectance sample $x_m$ and $w(x)$ is the weight function which can be chosen to unity. The two functions f1 and f2 are the constant function and the linear function $f(x)=x$. The remaining two that were used, are those derived from a $\text{sinc}(x)$-function. If the weight function, $w(x)$ is chosen to unity one will obtain calibration coefficients (c) that minimize the variance. If one also choose two of the base functions to be $\sin(\pi x)$ and $\sin(2\pi x)$ one will obtain solutions very similar to the Fourier expansion. The difference between these two originates only from the requirement that the constant and the linear functions are used to interpolate calibration data (at the end points) exactly in the Fourier case, while they are chosen freely by the least square algorithm. Consequently, the least square fit produces the smallest average error, but is not guaranteed to be exact at the end points.

The algorithm for the compensation is:

$$U(x)=c_1+c_2x+c_3f_3(x)+c_4f_4(x)$$

In another alternative embodiment of the invention a beam of electromagnetic radiation is projected on to at least a part of the SLM. The radiation source may for example be a laser, which may be continuous or pulsed. The part of the SLM, on which said electromagnetic radiation is projected, is used for said calibration. The part may for instance be one tenth of the SLM area, the half area of the SLM or the complete area of the SLM.

Next an image on an imaging detector is formed of said part of the SLM. Said imaging detector may for example be a CCD-camera, MOS-camera or a charge injection device. In said image darker and brighter regions may appear due to the different deflection states and reflectivity of the pixels in the SLM. The image corresponds to the image on the work piece 60.

Thereafter at least two pixels out of said part of the SLM are driven to a sequence of applied pixel control signals while measuring the dose from said individual pixels on said imaging detector. Said at least two pixels may for instance be a sub-matrix, where pixels in the sub-matrix are separated by pixels in a non-addressed state, i.e. no applied pixel control signal applied to the pixels.

Finally pixel calibrating data is computed from the measured dose data as a function of applied pixel control signal.

Optionally said imaging detector, e.g. the CCD camera, is precalibrated. The CCD-camera may be precalibrated by projecting a known electromagnetic radiation beam with approximately the same wavelength, e.g. a discharge lamp and an interference filter to select a narrow wavelength range close to the wavelength of the exposure beam, and measuring the dose in each pixel of the CCD-camera. The object of this precalibration is to be sure about that the same dose illuminated at each pixel in the CCD camera will be measured as the same dose, i.e. every pixel after said precalibration shall be equally sensitive to electromagnetic radiation, and by so doing the accuracy of the measurement will be enhanced.

The sub-matrix comprising at least two pixels is chosen in order not having to measure pixel by pixel in said SLM. The selected pixels in the SLM are not located next to each other but having a number of pixels in between, in order to reduce the likelihood of treating one spot on the CCD camera as coming from two or more pixels in the SLM, i.e. distinctive spots from individual SLM pixels on said CCD camera. The distance between two pixels in said sub-matrix is 5 pixels in each direction, but other separation distances may be used. As a general rule, a value 6σ of the dose of the radiation from the pixels in said sub-matrix may be a measure of the distance between the pixels in said sub-matrix.

FIG. 5 shows schematically a top view of the relation between the pixels in an imaging detector 250 and an energy distribution 275 from individual pixels in a SLM. The energy from the SLM pixels may take the form of a Gaussian distribution. In FIG. 5 the Gaussian distribution is schematically represented by circles, where very close circles, as in the center of each Gaussian distribution, represent high energy, and widely separated circles represent lower energy. As also can be seen from the same FIG. 5, is that the separation of the Gaussian distributions on the imaging detector 250 in a X direction is wider compared to the separation of the same distributions in a Y direction. In FIG. 5 the distance between the center of the Gaussian distributions in the X direction is 5 imaging detector pixels, while in the Y direction the distance between the same Gaussian distributions is 4 imaging detector pixels.

Optionally the pixels in the SLM are mapped with the pixels in the CCD camera to establish a known relation between the pixels in the SLM and the pixels in said CCD-camera. In this mapping step the center of the dose of the radiation from the pixels in the SLM can be aligned essentially in the center of the pixels in the CCD camera. Alignment errors of the order of 0.5 pixels cause the calibration algorithm to create spurious patterns in the image. This may be performed by measuring a center of the spot on the CCD and the position of the SLM image on the CCD is adjusted by a translation, magnification and/or rotation to fit the pixels on the CCD as described above in connection with the previous embodiment.

Alternatively the position of the spots on the CCD is measured and a region is computed for each pixel, so that a computer can assign the image at a particular location on the CCD to a corresponding SLM pixel.

Alternatively first a coarse grid of very few pixels in said SLM is measured on said CCD camera, for example a number of pixels, e.g. a cluster of 5 times 5 pixels may be chosen to begin with so a distinctive signal is given on the CCD. Said cluster of 5 times 5 pixels may be moved from one corner to another in the rectangular SLM area. The pixels in the cluster are set to a value, which is distinctive from the nearby unaddressed pixels.

The image on the CCD at this stage may correct for translation deviations between sad SLM and said CCD, i.e. scale errors, rotational errors etc. In the preferred embodiment of this invention the single pixels in the SLM are not resolved in the CCD camera.

Secondly a finer grid of the cluster of pixels in said SLM is measured on the CCD in order to locate which pixels in the SLM will create dose values on the CCD and where. At this stage with a finer grid the number of pixels at each pixel cluster in the SLM is reduced to 3 times 3 pixels with for example 10 pixels in between each cluster.

Thereafter a further refinement of the grid of cluster of pixels in the SLM is measured on the CCD, this time for example with single pixels in the SLM with 5 pixels in between such.

As a further improvement, a correction for the spot position relative to a CCD pixel grid may be applied to remove or reduce Moire effects due to insensitive area between the CCD pixels or similar effects. The magnification in the projection system may or may not be adjusted, so that the image of the sub-matrix is adjusted with the pixel pattern on the CCD, e.g. the CCD may have one pixel per two pixels in the SLM or another rational relation. The CCD pixels typically have a capacity of 100.000 electrons. In the measurement region formed by several pixels the capacity may be larger by a numerical factor representing the number of pixels, e.g. 4 or 16 as shown in FIG. 5. The typical number of electrons in a region is 200.000 and the number has a statistical distribution (Poisson distribution). To average this random effect as well as other randomness every measurement is repeated N times. At the same time Moire effects can be averaged if the image is moved over the CCD-camera during the N measurements.

The CCD-camera is for example a camera from Kodak® KAF 1600 with approximately 1000*1600 pixels and sensitivity for the wavelength used, e.g. 248 nm or 197 nm. Typically this involves converting the radiation to visible light by a fluorescent dye, but camera chips which are directly sensitive to short wavelength, e.g. 248 nm are also available.

In order to calibrate all pixels in the illuminated part of the SLM said at least two pixels at a time are changed and driven to a sequence of applied pixel control signals. Now we have knowledge about the doze on the CCD as a function of control signal for each pixel. With the knowledge of doze as a function of applied voltage for every pixel a state is computed representing average zero dose of electromagnetic radiation onto the detector arrangement out of the measured dose data.

Thereafter at least the most adjacent pixels to the pixels in said sub-matrix are arranged in said computed state.

As can be seen from FIG. 8, the pixels 10, 11, 12, 13, 14, 15, 16 in an electrostatically unattracted state may be in a random state of deflection and therefore may contribute to the radiation dose at a specific CCD-camera pixel and thereby decrease the accuracy of the measured dose. In order to eliminate or at least reduce an inaccuracy in the measured dose coming from a specific SLM pixel, at least the closest SLM pixels to said at least two pixels in said part of the SLM are arranged in said computed state.

Not only the most adjacent pixels to said at least two pixels in said SLM may be set to said computed state, preferably all pixels other than said at least two pixels in said SLM are set to said computed state.

Thereafter at least two pixels at a time in said SLM are driven again to a sequence of applied pixel control signals while measuring the dose of the electromagnetic radiation, while at least the most adjacent pixels to said at least two pixels in the SLM are set to said computed state. After having completed the calibration of all pixels in said part of the SLM a second time, a new state is computed for each pixel corresponding to average zero dose of electromagnetic radiation onto the imaging detector out of the second measured dose data. This procedure is repeated until for example the standard deviation of the measured intensities is below 0.5%.

The dose of the pixels in said sub-matrix is measured in said CCD camera. The CCD camera does not have to resolve single pixels, because only one sub-matrix is changed at a time. The change of a single pixel can be inferred from the measurement. The density of the sub-matrix may be chosen to make the spots on the CCD essentially non-overlapping. The CCD may or may not have the same number of pixels as the SLM. The light in the CCD-camera image within a certain area is assumed to come from one pixel in the SLM, provided that the surrounding SLM pixels do not change.

Optionally a compensation for energy variations in different electromagnetic radiation pulses is performed. The calibration of the pixels may be performed by illuminating said sub-matrix of pixels in said SLM by a pulsed laser and measuring and calculating the dose from one or a plurality of laser pulses and correcting the measured CCD data for the measured pulse energy.

Said projecting of electromagnetic radiation from said sub-matrix of pixels onto the detector arrangement for measuring dose of electromagnetic radiating may be performed after Fourier filtering of said electromagnetic radiation. In FIG. 3 a beam splitter 90 is arranged between the spatial filter 70 and the first lens arrangement 50.

After having measured the dose for the pixels in said sub-matrix for a given voltage applied to said pixels, said voltage applied to the pixels in said sub-matrix is changed and the procedure is repeated for a number of different voltages. For example may the dose from a maximum value to a minimum value be divided into 65 values. After having applied all different voltages to the sub-matrix of pixels the procedure may be repeated for all sub-matrices 200 in order to cover said part of the SLM onto which the beam of electromagnetic radiation is projected. The sub-matrix may or may not change pattern from one position to another in said 2-dimensional array of pixels.

The beam of radiation is projected on to the other parts of the SLM in order to calibrate all pixels in said SLM. Preferably the same size of the beam is used but the size may change with the result of covering different sizes of the parts of the SLM.

The pixel correction data is generated either by storing every dose value for a given control signal, which in this case is a potential difference between the mirror and the address/control electrode, for every pixel in a data base or more preferably by transforming the measured dose as a function of applied voltage onto said pixel as a transfer function. Said transfer function is preferably a given formula e.g. $C1+XC2+C3T3(X)+C4T4(X)$ equal for every pixel. The procedure for computing the constants C1, C2, C3 and C4 may be similar to what is described in connection with the previous embodiment. The procedure for finding the base functions may also be similar to what is described in connection with the previous embodiment. For example $C1+xC2$ is the formula of the straight line $T3(x)$ and $T4(x)$ may in this case two tabulated functions. T3 and T4 can be chosen so that the formula gives an adequate description of all pixels.

FIG. 12 shows schematically a flow chart of another embodiment of the method according to the invention for calibrating pixels in a Spatial Light Modulator (SLM).

Figure 6:
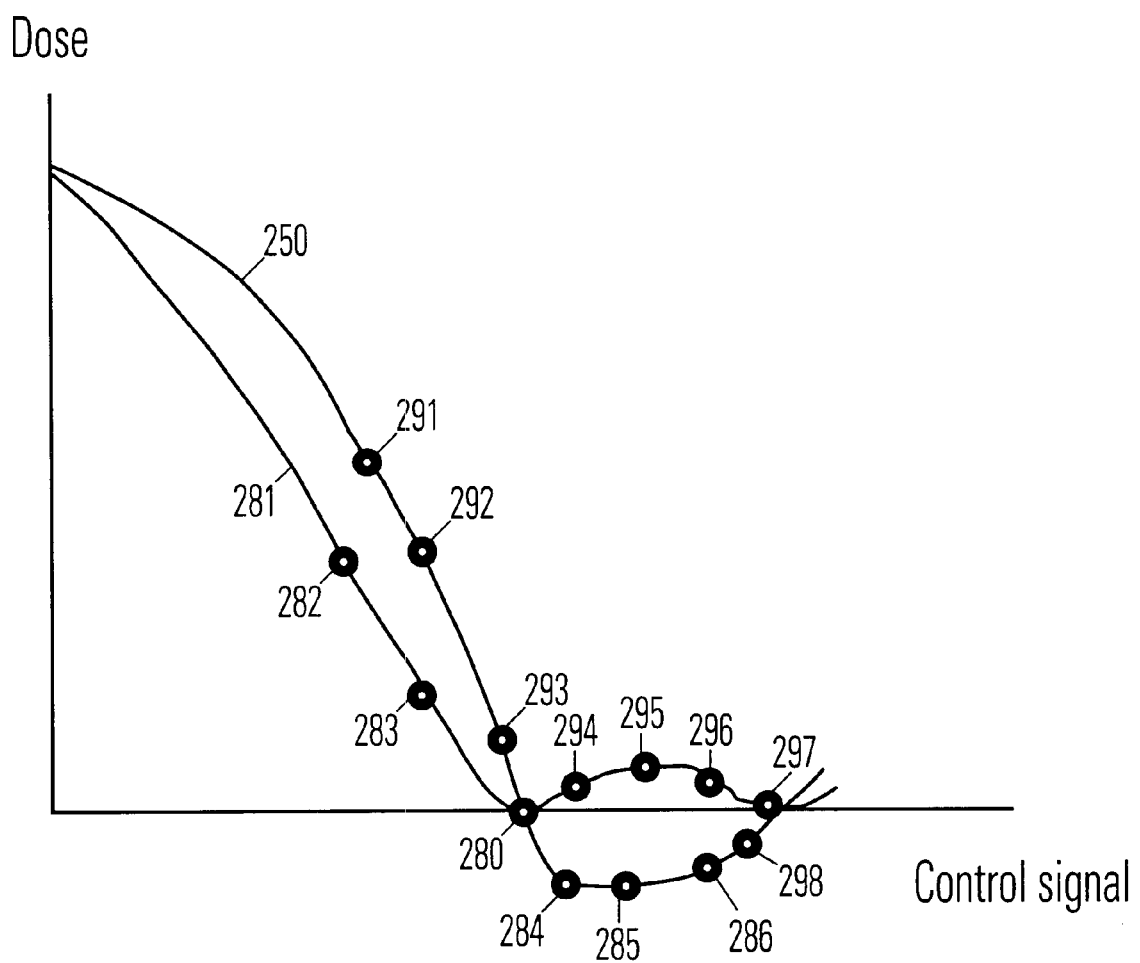
FIG. 6 illustrates the relationship between the control signal applied to a pixel of an SLM and the resulting energy and electromagnetic field amplitude.
Figure 7:
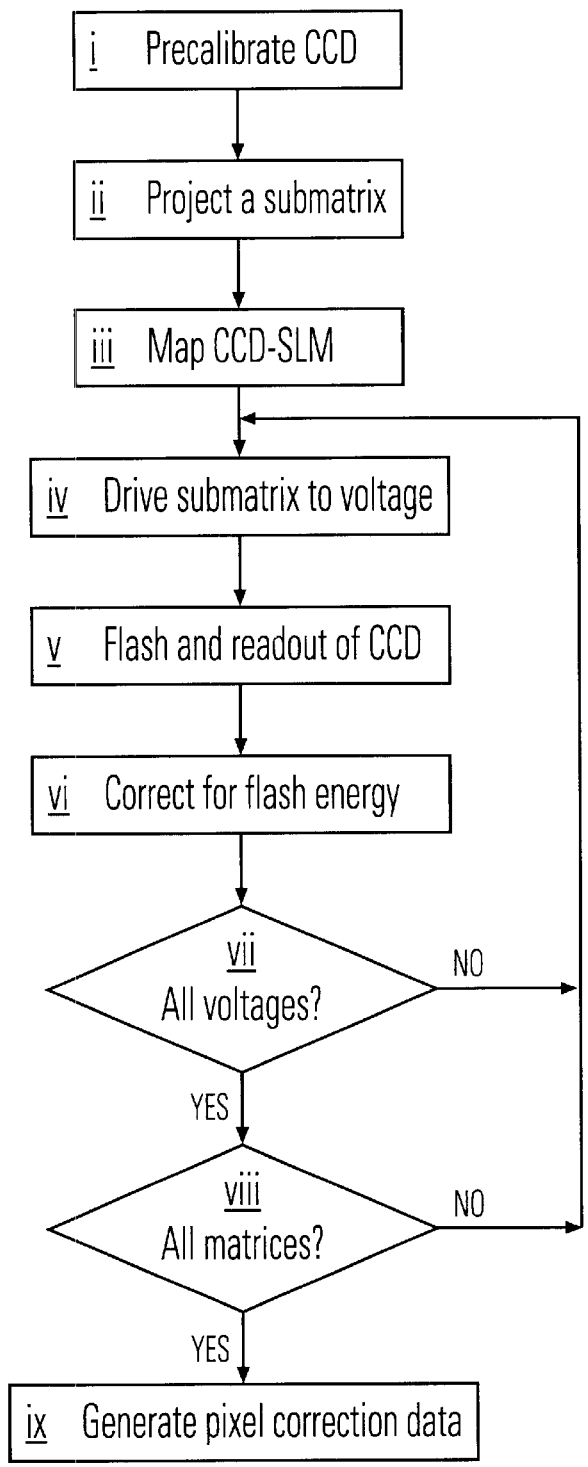
FIG. 7 illustrates a flowchart of one calibration method.

In FIG. 6 it is shown a typical example of a relation between measured dose on the imaging detector and applied pixel control signal for a pixel in a SLM, this is illustrated by curve 275. In the same FIG. 6 a curve 260 represents an amplitude of the electromagnetical field as a function of applied pixel control signal. The relation between the dose curve 275 and the amplitude curve 260 is that the dose curve 275 is the square of the amplitude curve 260.

The dose curve can for example be approximated with a $(sinx/x)^2$ function and the amplitude curve would then be a $sinx/x$ function.

Another way of finding as correct zero dose from a single pixel as possible is to use the above-mentioned fact that the dose curve can be approximated with a $(sinx/x)^2$ function. If the local maximum at 275 in measured the local minimum points can easily be computed out of said function. The reason why local maximum is easier to measure than the factual minimum point, is that the signal in the CCD-camera at the minimum point will disappear in the noise that is always present this is not the case with the local maximum at point at the dose curve.

Figure 14:
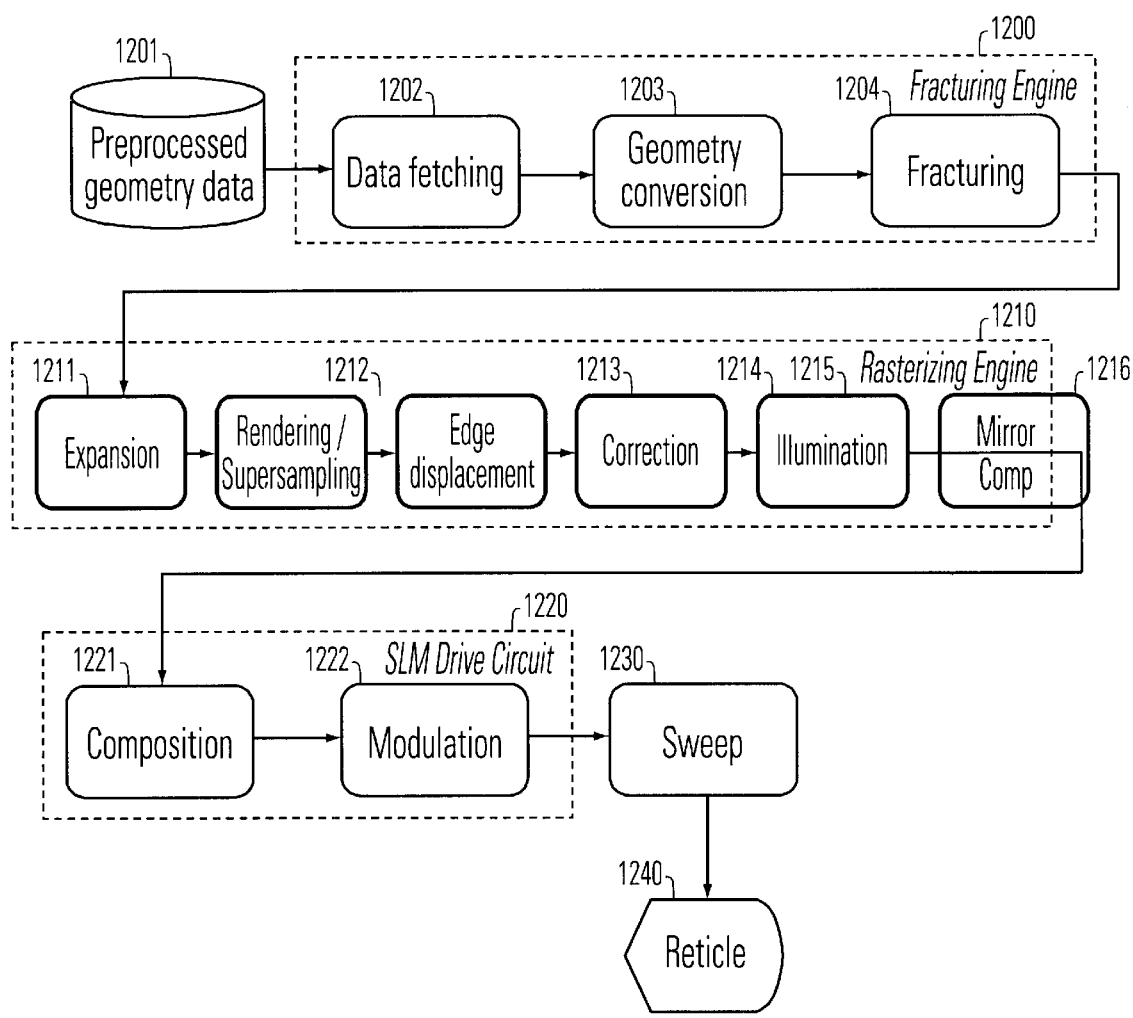
FIG. 14 illustrates an overview of the data path.

The image rendering engine of the present invention can be used in conjunction with a fracturing engine, rasterizing engine and drive circuit. FIG. 14 provides a data path overview. This data path begins with preprocessed geometry data 1201 as input. Preprocessed geometry data may be the output of a computer-aided design system. Preprocessing may reduce hierarchical or iterative information and effectively flatten the geometry representation stream. Data fetching 1202 typically includes obtaining preprocessed geometry data from a secondary storage device. Geometry conversion 1203 is the process in which geometries are converted to renderable fixed-point geometries (RFG). Fracturing 203 is the process of partitioning geometries into different windows and sub windows which correspond, in a micro mirror implementation, to stamps and rendering windows of the stamp. The output of the fracturing engine is geometry data in one or more specified record formats. The records represent geometric figures, such as polygons and groups of polygons. It is useful to represent the fractured data as trapezoids, where triangles and rectangles are sub classes of trapezoids. One of the parallel edges of the trapezoid may have a zero or near-zero length, to represent a triangle. Another useful representation of fractured data is as triangles or chains of triangles. Most aspects of the present invention are equally suited to trapezoids, rectangles, triangles or other polygons or geometric figures. Coordinates of the polygon corners may be given with a sub-pixel or half sub-pixel resolution of 7 or bits or more, to support an accuracy of one $64^{th}$ or $128^{th}$ of a pixel or greater. Higher and lower bit resolutions may be used, depending on the desired accuracy and the characteristics of the image projection technology.

The image-rendering engine 210 includes a variety of components. Expansion 1211 is the process of expanding geometry iteration prior to rendering. Fractured geometry may be received as iterated RFGs, with repeated geometric figures or repeated groups of geometric figures. Expansion ungroups the RFGs so they can be processed individually. Rendering 1212 is the process of converting polygons, including renderable fixed-point geometries, to rasterized images. The rendering process is carried out on multiple rendering processors. Super sampling 1212 is the process of sampling the micropixel resolution image and calculating grayscale pixel values. Alternative weighting schemes for super sampling are discussed below. Edge displacement 1213 is the process of shrinking or expanding geometries, for instance to compensate for proximate and stray radiation by laser proximity correction (LPC) or by optical proximity correction (OPC). Image correction 1214 is the process of compensating for non-linearities and minor defects in the optical path, the placement of the stage or another feature of the projection system. This may include non-linear image recoupling. Illumination conversion 1215 takes into account factors such as overlap between projected regions, variations in exposing radiation, and multi-pass writing. Mirror compensation 1216 applies pre-calibrated factors to compensate for idiosyncrasies of individual mirrors, when the projection system uses a micromirror array. Mirror compensation factors can be used to compensate for differential response to voltages, for change in response during the course of a work cycle, for a dead pixel in an array, or similar characteristics of a micromirror array. Additional components can be added to the rendering engine 1210 as needed and as appropriate to the projection system being used.

The drive circuit 1220 includes composition 1221 and modulation 1222 processes. Composition 1221 is the process of combining results from several rendering processes into one or more data streams to which modulation is responsive. Use of a composer allows the number of rendering modules 1330 to be scaled. For instance, the number of rendering modules may be increased from 10 to 12 by modification of composer parameters, without changing the interface to the modulation system. In one type of micromirror system, one data stream may be used for modulation, to set individual micromirrors before flashing the micromirror array with radiation. In another type of micromirror system the number of data streams may match the number of micromirrors or a factor of the number of micromirrors, if the micromirrors are used for scanning a work piece. In a conventional scanning system, the number of data streams may match the number of scanning beams used. Modulation 1222 is the process that converts concentrated data into driving values for the projection system. For a micromirror system, a digital-to-analog converter can be used to produce analog voltages that are applied to individual mirror elements. For a scanning system, drive signals may be used to control an acousto-optical modulator that modulates the radiation beams or an equivalent control element for electron, ion or particle radiation.

A non-linear transform may require application of a pixel resampling gradient to each pixel being resampled. Alternatively, gradients for each pixel could be sampled by a convolution kernel to produce an output pixel value. The neighborhood of the convolution kernel will depend on the maximum allowed magnitude of the gradient. A one pixel gradient could be sampled by a 3×3 kernel; a two pixel gradient by a 5×5 kernel.

A projection system typically also includes a sweep 1230 and a reticle 1240. The sweep 1230 carries image information across the field of the reticle 1240, which is being exposed to radiation. The reticle 1240 is the work piece against which the projection system operates.

Figure 15:
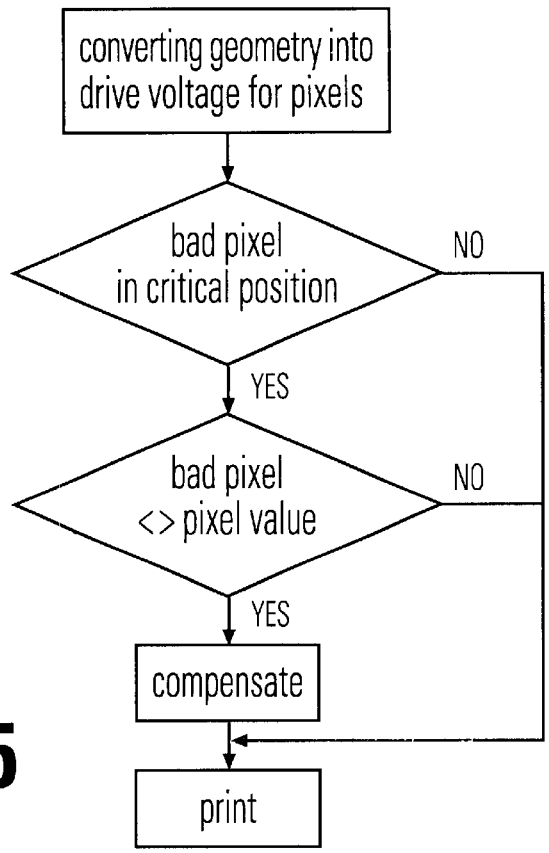
FIG. 15 illustrates another embodiment of the invention.

FIG. 15 illustrates a flow chart of a further embodiment according to the invention. First the geometries are converted into steering signals for each pixel according, for instance, to what was described in connection to FIG. 14. Thereafter it is determined where bad pixels are located and determined if said bad pixels are located in a critical position. A bad pixel, for example a black pixel, located near an edge may introduce an error in the pattern.

A bad pixel, i.e., a mirror stuck to a limited range of angles, may be identified in a variety of ways. It is possible to calibrate the SLM and find the defective pixels by searching for elements that have unusual calibration properties. However, the calibration procedure may be negatively influenced by the bad pixels.

Generally, with a non-calibrated SLM said SLM may be addressed with steering signals, for instance voltages, and an image of the SLM is recorded with a digital camera. The image is then processed using image analysis. One or more images (at different voltages) may be required to identify position and magnitude of the bad pixel(s).

In one embodiment are all mirrors driven with a constant voltage. Said voltage may represent any grayscale value. The image is recorded with a CCD camera and image analysis is used to detect the bad pixel. For example may a gradient field be computed from the recorded CCD-image. A divergence of the gradient (Del2) is computed, where Del2 is the Laplace's differential operator, in order to identify positions in the image where a spatial second derivative of the intensity has extremes. Said extremes, for example a maximum and minimum, may represent bad pixels. The Del2 function may be set with a threshold value, and any position above said threshold value may represent a bad pixel. The procedure may be repeated with the mirrors driven to at least one other constant voltage, preferably the constant voltages are well separated from each other. Suspected bad pixels are considered to be confirmed if the same pixel shows up on repeated measurements or with complementary measurements.

Having images representing different settings for the pixels a difference between said image may be calculated. The difference has a local minimum at a stuck or damaged pixel.

For a binary (on-off) SLM, it may in some configurations be difficult to use the before mentioned methods. Instead a pattern is applied on the SLM. Bad pixels have largest influence at feature edges. A pattern containing parallel black and white lines or a chessboard pattern will highlight the pixels that are on the edges. Said pattern are preferably near the optical resolution limit. By driving a sequence of patterns, e.g., parallel lines, to the SLM and taking CCD images of each pattern will allow identification of defective elements although it may not be optically resolved in the images. The lines in the different images are moved for identification where a defective pixel is located. The CCD images are compared with pattern data. For example, the SLM may be addressed with lines and spaces and its complement in two images. By analyzing the line width in the two images a bad pixel can be detected and its magnitude determined. For example, a bad pixel stuck to a white value gives a line width error only when it is on black area and vice versa. However, a gray pixel give errors both in a black and a white area. The difference of the errors contains information about the magnitude of the defect.

To compensate for a black pixel the neighbouring pixels may be set to a more intense state, i.e., a state in which more electromagnetic radiation will be reflected onto the workpiece. If bad pixel is near an edge, software may adjust the neighboring pixels. In practice, this can be accomplished by changing the pixel value, i.e., the degree of deflection of the adjacent mirrors, or changing the transfer function of the adjacent pixels. This type of compensation may be used in one or a plurality of writing passes. The change of the neighbouring pixels may be performed by on line calculation or using a lock-up table.

The invention allows the correction for bad pixels that reduces the error dramatically in a multipass scheme with constant corrections to the transfer functions. With only one or two passes the correction may not be sufficient to satisfy the requirements posed in a particular case. In a more elaborate embodiment the correction is made dependent on the actual pattern. Typically only certain geometrical cases are critical and those can be characterized and suitable bad pixel correction data and can be stored in a look up table or in algorithmic form. During printing, the pattern near the bad pixels is analysed in real time, the suitable correction, if necessary, is identified and applied. With only a few defective pixels per SLM the computing work is manageable. In this way an almost perfect correction can be made with analog mirrors and a much improved correction can be accomplished with binary (on-off) elements.

In one embodiment, bad pixels at a distance of one pixel inside or outside the feature edge is regarded as bad pixels in critical position. In another embodiment bad pixels at a distance of two pixels inside or outside the feature edge is regarded as bad pixels in critical position. In still another embodiment bad pixels at a distance of three pixels inside or outside the feature edge is regarded as bad pixels in critical position.

Figure 16:
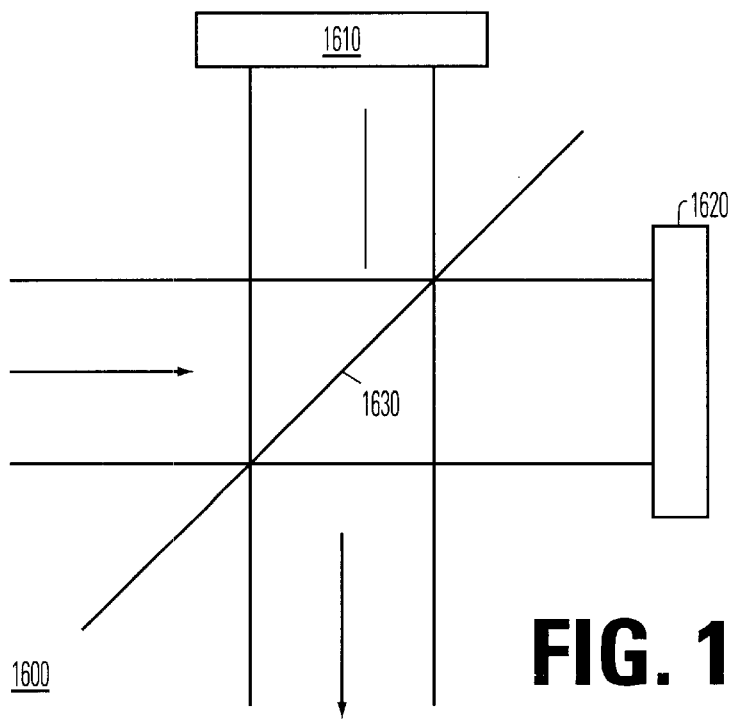
FIG. 16 illustrates an alternative setup of the pattern generator.

In yet another embodiment of the present invention a plurality of SLMs are used for compensation of bad pixels. In FIG. 16 an exemplary embodiment of a setup is illustrated. Said figure comprising a first SLM 1610, a second SLM 1620 and a beamsplitter 1630. Said arrangement is introduced instead of SLM 30 in FIG. 3. The individual SLMs, for example first SLM 1610 and the second SLM 1620, may be fed with the same pattern data. The calibrating functions for individual pixels in said first and said second SLM are however unique. The SLM area may be calibrated together so that each pixel in the first SLM corresponds to a group of pixels in the second SLM. This may be done in both ways. By so doing one will get a one to four relationship of pixels in both directions. Differences of the SLM will in this way be corrected for. Some geometrical systematical errors in the SLM itself may be cancelled out if the first SLM is rotated 180 degrees relative to the second SLM. The first and second SLM may be illuminated by the same intensity of electromagnetic radiation. However, by illuminating said first and said second SLM by different intensities a further degree of grayscaling may be accomplished. The number of grayscales will in such embodiment depend upon a relation and absolute value of the two intensities. For example, if the pixels in said first and second SLM may be set to 16 levels and radiation from said second SLM is 1/16 of the radiation from said first SLM the number of grayscale levels is 16×16=256 levels. Speckle may also be reduced or cancelled by using a plurality of SLMs.

Thus, although there has been disclosed to this point particular embodiments of the apparatus for patterning a work piece, it is not intended that such specific references be considered as limitations upon the scope of this invention except in-so-far as set forth in the following claims. Furthermore, having described the invention in connection with certain specific embodiments thereof, it is to be understood that further modifications may suggest themselves to those skilled in the art, it is intended to cover all such modifications as fall within the scope of the appended claims.

What is claimed is:

1. A method for compensating the impact of at least one defective pixel with a known position in at least one spatial light modulator (SLM) when creating a pattern of said at least one SLM on a work piece covered at least partly with a layer sensitive to electromagnetic radiation, comprising the actions of:

providing a source for emitting electromagnetic radiation, illuminating by said radiation said at least one SLM having a plurality of modulating elements (pixels), projecting in a writing pass an image of said modulator on said work piece, performing a compensation for defective pixels in at least one other writing pass.

2. The method according to claim 1, wherein said electromagnetic radiation is a pulsed laser source.

3. The method according to claim 1, wherein said compensation for said at least one defective pixel is performed by using a single compensation pixel for each defective pixel.

4. The method according to claim 1, wherein said compensation for said at least one defective pixel is performed by using a plurality of compensation pixels for each defective pixel.

5. The method according to claim 1, wherein said at least one SLM is illuminated by equivalent radiation dose in the different writing passes.

6. The method according to claim 1, wherein said at least one SLM is illuminated by different radiation intensities in the different writing passes.

7. The method according to claim 1, wherein said at least one SLM is a transmissive Spatial Light Modulator.

8. The method according to claim 1, wherein said at least one SLM is a reflective Spatial Light Modulator.

9. The method according to claim 1, wherein the pixels in said at least one SLM is operated in an analog manner.

10. A method for compensating the impact of at least one defective pixel with a known position in at least one spatial light modulator (SLM) when creating a pattern of said at least one SLM on a work piece covered at least partly with a layer sensitive to electromagnetic radiation, comprising the actions of:

providing a source to emit electromagnetic radiation, illuminating by said radiation said at least one SLM having a plurality of modulating elements (pixels), projecting an image of said at least one SLM on a detector arrangement to measure a dose of radiation performing a compensation of said defective pixel by at least one of the most adjacent pixels in said at least one SLM.

11. The method according to claim 10, wherein said compensation is performed by assigning each of said at least one of the most adjacent pixels by a value given by subtraction of an intended pixel value by a actual pixel value, divided by the number of most adjacent pixels used for compensation.

12. A method for compensating the impact of at least one defective pixel in at least one spatial light modulator (SLM)

when creating a pattern of said at least one SLM on a work piece covered at least partially with a layer sensitive to electromagnetic radiation, comprising the action:

setting the pixels in said at least one SLM in a predetermined state, illuminating by a radiation source said at least one SLM, projecting the image of said at least one SLM on a measuring device, measuring the dose of the pixels, identifying defective pixels, performing a compensation for said defective pixels in at least one writing pass by means of pixels in said at least one SLM other than said defective pixels.

13. A method for compensating the impact of at least one defective pixel with a known position in at least one spatial light modulator (SLM) when creating a pattern of said at least one SLM on a work piece covered at least partly with a layer sensitive to electromagnetic radiation, comprising the actions of:

providing a source for emitting electromagnetic radiation, illuminating by said radiation said at least one SLM having a plurality of modulating elements (pixels), projecting in a first writing pass an image of said modulator on said work piece using a first set of pixels in said at least one SLM, performing a pre compensation of at least one defective pixel in at least one subsequent writing pass by at least one compensation pixel in at least one prior writing pass, projecting in at least a second writing pass said image of said modulator on said workpiece using at least a second set of pixels in said at least one SLM.

14. The method according to claim 13, further comprising the action of:

performing a post compensation of at least one defective pixel in at least one prior writing step by at least one compensation pixel in at least one subsequent writing pass.

15. A method for compensating the impact of at least one defective pixel with a known position in at least one spatial light modulator (SLM) when creating a pattern of said at least one SLM on a work piece covered at least partly with a layer sensitive to electromagnetic radiation, comprising the actions of:

providing a source for emitting electromagnetic radiation, illuminating by said radiation said at least one SLM having a plurality of modulating elements (pixels), projecting in a first writing pass an image of said modulator on said work piece using a first set of pixels in said at least one SLM, performing a post compensation of at least one defective pixel in at least one prior writing pass by at least one compensation pixel in at least one subsequent writing pass, projecting in at least a second writing pass said image of said modulator on said workpiece using at least a second set of pixels in said at least one SLM.

16. The method according to claim 15, further comprising the action of:

performing a pre compensation of at least one defective pixel in at least one subsequent writing step by at least one compensation pixel in at least one prior writing pass.

17. The method according to claim 13 or 15, wherein said electromagnetic radiation is a pulsed laser source.

18. The method according to claim 13 or 15, further comprising the action of:

including at least one pixel in said first set of pixels in said at least second set of pixels.

19. The method according to claim 13 or 15, wherein said compensation for said at least one defective pixel is performed by using a single compensation pixel for each defective pixel.

20. The method according to claim 13 or 15, wherein said compensation for said at least one defective pixel is performed by using a plurality of compensation pixels for each defective pixel.

21. The method according to claim 13 or 15, wherein said at least one SLM is illuminated by the same radiation dose in different writing passes.

22. The method according to claim 13 or 15, wherein said at least one SLM is illuminated by different radiation dose in different writing passes.

23. The method according to claim 13 or 15, wherein said at least one SLM is a transmissive Spatial Light Modulator.

24. The method according to claim 13 or 15, wherein said at least one SLM is a reflective Spatial Light Modulator.

25. The method according to claim 13 or 15, wherein the pixels in said at least one SLM is operated in an analog manner.

26. The method according to claim 13 or 15, wherein an image of said pixels in said first writing pass is displaced in said at least one SLM relative said image of said pixels in said second writing pass by one or a plurality of pixels.

27. The method according to claim 13 or 15, wherein an image of said pixels in said first writing pass is displaced on said workpiece relative said image of said pixels in said second writing pass by at least a fraction of a pixel.

28. The method according to claim 13 or 15, wherein said first set of pixels belong to a first SLM and said second set of pixels belong to a second SLM.

29. The method according to claim 28, wherein said first and second SLM:s are illuminated simultaneously.

30. The method according to claim 29, wherein said first and second SLM:s are illuminated by different radiation intensities.

31. A method for compensating the impact of at least one defective pixel with a known position in at least one spatial light modulator (SLM) when creating a pattern of said at least one SLM on a work piece covered with a layer sensitive to electromagnetic radiation, comprising the actions of:

fracturing and rendering the pattern to be printed, calculating exposure values for at least one SLM pixels, locating bad pixels, determine if said bad pixels are in a critical position, providing a source for emitting electromagnetic radiation, illuminating by said radiation said at least one SLM having a plurality of modulating elements pixels), compensating for bad pixels in critical positions.

32. An apparatus for compensating the impact of at least one defective pixel with a known position in at least one spatial light modulator (SLM) when creating a pattern of said at least one SLM on a work piece covered at least partly with a layer sensitive to electromagnetic radiation, comprising a source to emit electromagnetic radiation, a projection system to project in a first writing pass an image of said modulator on said work piece using a first set of pixels in said at least one SLM, at least one pixel in said at least one SLM in at least one prior writing pass to perform a pre compensation of defective pixels in at least one subsequent writing pass, a projection system to project in at least a second writing pass said image of said modulator on said workpiece using at least a second set of pixels in said at least one SLM, at least one pixel in said at least one SLM in at least one latter writing pass to perform a post compensation of defective pixels in at least one prior writing pass.

33. The apparatus according to claim 32, wherein said electromagnetic radiation is a pulsed laser source.

34. The apparatus according to claim 32, wherein at least one pixel in said first set of pixels is included in said at least a second set of pixels.

35. The apparatus according to claim 32, wherein said projection system to project in at least a second writing pass comprises said SLM reprogrammed with the image to be written on said work piece with said at least second set of pixels, a movable stage upon which stage said work piece is arranged in order to illuminate the same feature on said work piece with said at least second writing pass as said first writing pass.

36. The apparatus according to claim 32, wherein said movable stage is moved the length of N SLM pixels.

37. The apparatus according to claim 36, wherein said stage is moved along a row of pixels.

38. The apparatus according to claim 36, wherein said movable stage is moved along a column of pixels.

39. The apparatus according to claim 36, wherein said movable stage is moved along both a row of pixels and a column of pixels.

40. The apparatus according to claim 32, wherein said movable stage is moved the length of N SLM pixels plus a fraction of a SLM pixel.

41. The apparatus according to claim 32, wherein a single defective pixel is compensated in one writing pass with a single compensating pixel in another writing pass.

42. The apparatus according to claim 32, wherein a single defective pixel in one writing pass is compensated with a plurality of compensating pixel in another writing pass.

43. The apparatus according to claim 32, wherein said at least one SLM is illuminated by a same radiation dose in the different writing passes.

44. The apparatus according to claim 32, wherein said at least one SLM is illuminated by different radiation intensities in the different writing passes.

45. The apparatus according to claim 32, wherein said at least one SLM is a transmissive Spatial Light Modulator.

46. The apparatus according to claim 32, wherein said at least one SLM is a reflective Spatial Light Modulator.

47. The apparatus according to claim 32, wherein the pixels in said at least one SLM is operated in an analog manner.

48. An apparatus for compensating the impact of at least one defective pixel with a known position in at least one spatial light modulator (SLM) when creating a pattern of said at least one SLM on a work piece covered at least partly with a layer sensitive to electromagnetic radiation, comprising a source for emitting electromagnetic radiation, a projection system for illuminating said at least one SLM, having a plurality of modulating elements (pixels), by said radiation and projecting in a writing pass an image of said modulator on said work piece, a detector arrangement (65) for measuring the dose of pixels from the image of said at least one SLM and a computer (66) for performing a compensation for defective pixels in at least one other writing pass out of said image on said detector (65).

49. An apparatus for compensating the impact of at least one defective pixel with a known position in at least one spatial light modulator (SLM) (30) when creating a pattern of said at least one SLM (30) on a work piece (60) covered at least partly with a layer sensitive to electromagnetic radiation, comprising a source for emitting electromagnetic radiation, a projection system for illuminating said SLM (30), having a plurality of modulating elements (pixels), by said radiation and projecting in a writing pass an image of said modulator (30) on said work piece (60), a detector arrangement (65) for measuring the dose of pixels from the image of said at least one SLM, and a computer (66) for performing a compensation for defective pixels (110) by using at least one of the most adjacent pixels (111, 112, 113, 114, 115, 116, 117, 118) to said defective pixel (110).

50. The apparatus according to claim 48 or 49, wherein the pixel intensities is detected by said detector arrangement (65) whenever a new work piece (60) is to be patterned.

51. A method for detecting at least one defective pixel in at least one SLM, comprising the actions of addressing all pixels in said at least one SLM with a first steering signal, illuminating said at least one SLM with electromagnetic radiation, recording an image of said at least one SLM, computing a gradient field of the recorded image, computing a divergence of the gradient field, identifying extreme values from the computed divergence which corresponds to defective pixels.

52. The method according to claim 51, further comprising the actions of addressing all pixels said at least one SLM with a second steering signal, illuminating said at least one SLM with electromagnetic radiation, recording an image of said at least one SLM, computing a gradient field of the recorded image, computing a divergence of the gradient field, identifying extreme values from the computed divergence, where defective pixels corresponds to extreme values from said first steering signal and said second steering signal representing same pixels.

53. A method for detecting at least one defective pixel in at least one SLM, comprising the actions of addressing all pixels in said at least one SLM with a first steering signal, illuminating said at least one SLM with electromagnetic radiation, recording a first image of said at least one SLM, addressing all pixels in said at least one SLM with a second steering signal, illuminating said at least one SLM with electromagnetic radiation, recording a second image of said at least one SLM, computing the difference between said first image and said second image, identifying bad pixels where the computed difference has a local minimum.

54. A method for detecting at least one defective pixel in at least one SLM, comprising the actions of addressing a pattern to said at least one SLM, illuminating said SLM with electromagnetic radiation, recording a first image of said at least one SLM, comparing said recorded image with pattern data at feature edges, identifying bad pixels where the feature edge is moved a predetermined distance.

55. The method according to claim 54, wherein said pattern is a chessboard pattern.

56. The method according to claim 54, wherein said pattern is a pattern with parallel lines.

57. The method according to claim 54, further comprising the action of addressing said pattern with another set of pixels in said at least one SLM, illuminating said SLM with electromagnetic radiation, recording a second image of said at least one SLM, comparing said recorded second image with pattern data at feature edges, identifying bad pixels where the feature edge is moved a predetermined distance.

58. The method according to claim 57, further comprising the action of comparing the feature edge movement in said first image with said second image for identifying bad pixels stuck at intermediate values.

59. The method according to claim 5, wherein said different writing passes is performed by means of one SLM.

60. The method according to claim 59, wherein different areas of said SLM are used in the different writing passes.

61. The method according to claim 5, wherein said different writing passes is performed by means of a plurality of SLMs.

62. The method according to claim 6, wherein said different writing passes is performed by means of one SLM.

63. The method according to claim 62, wherein different areas of said SLM are used in the different writing passes.

64. The method according to claim 6, wherein said different writing passes is performed by means of a plurality of SLMs.

* * * * *